(12) United States Patent
Berk et al.

(10) Patent No.: US 12,278,304 B2
(45) Date of Patent: Apr. 15, 2025

(54) HIGH MODULATION SPEED PIN-TYPE PHOTODIODE

(71) Applicant: Mellanox Technologies, Ltd., Yokneam (IL)

(72) Inventors: Yuri Berk, Kirvat Tivon (IL); Vladimir Iakovlev, Ecublens (CH); Tamir Sharkaz, Kfar Tavor (IL); Elad Mentovich, Tel Aviv (IL); Matan Galanty, Korazim (IL); Itshak Kalifa, Bat-Yam (IL); Paraskevas Bakopoulos, Ilion (GR)

(73) Assignee: Mellanox Technologies, Ltd., Yokneam (IL)

( * ) Notice: Subject to any disclaimer, the term of this patent is extended or adjusted under 35 U.S.C. 154(b) by 210 days.

(21) Appl. No.: 17/249,140

(22) Filed: Feb. 22, 2021

(65) Prior Publication Data
US 2022/0246781 A1    Aug. 4, 2022

(30) Foreign Application Priority Data
Feb. 4, 2021   (GR) .............................. 20210100075

(51) Int. Cl.
*H01L 31/105* (2006.01)
*H01L 31/0304* (2006.01)

(52) U.S. Cl.
CPC ...... *H01L 31/105* (2013.01); *H01L 31/03046* (2013.01)

(58) Field of Classification Search
CPC ........... H01L 31/03046; H01L 31/1013; H01L 31/105; H01L 31/1075; H01L 31/03529;
(Continued)

(56) References Cited

U.S. PATENT DOCUMENTS

| | | | | |
|---|---|---|---|---|
| 5,034,783 | A | * | 7/1991 | Chang ..................... G02F 1/017 257/14 |
| 5,210,428 | A | * | 5/1993 | Goossen ......... H01L 31/035236 257/17 |

(Continued)

FOREIGN PATENT DOCUMENTS

| | | |
|---|---|---|
| CN | 105720130 A | 6/2016 |
| CN | 105283964 A | 10/2016 |

(Continued)

OTHER PUBLICATIONS

"Photodiode and Manufacturing Method Therefor" (JP 2012124404) (Year: 2012).*

(Continued)

*Primary Examiner* — Edward Chin
(74) *Attorney, Agent, or Firm* — Anup Iyer; Moore & Van Allen PLLC

(57) ABSTRACT

Various embodiments of improved PIN-type photodiodes are provided. In an example embodiment, the PIN-type photodiode includes a p-type contact; an n-type contact; a first absorbing layer disposed between the p-type contact and the n-type contact; and a second absorbing layer disposed between the first absorbing layer and the n-type contact. The first absorbing layer is characterized by a first absorption coefficient and the second absorbing layer is characterized by a second absorption coefficient. The second absorption coefficient is greater than the first absorption coefficient. In another example embodiment, the PIN-type photodiode includes a p-type contact; an n-type contact; a first absorbing layer disposed between the p-type contact and the n-type contact; and a non-absorbing accelerating layer disposed between absorbing layers and non-absorbing drift layer and the n-type contact.

24 Claims, 4 Drawing Sheets

(58) Field of Classification Search
CPC ..... H01L 31/035281; H01L 31/035236; H01L 31/035218; H01L 27/14694; H01L 27/14652

See application file for complete search history.

(56) References Cited

U.S. PATENT DOCUMENTS

| | | | | |
|---|---|---|---|---|
| 5,844,260 | A * | 12/1998 | Ohori | H01L 29/7783 257/190 |
| 6,130,466 | A * | 10/2000 | Schneider | H01L 31/0352 257/458 |
| 6,740,908 | B1 * | 5/2004 | Giboney | H01L 31/105 257/190 |
| 9,748,427 | B1 * | 8/2017 | Rajavel | H01L 31/03046 |
| 11,056,604 | B1 * | 7/2021 | Shi | H01L 31/1075 |
| 2004/0056250 | A1 | 3/2004 | Wang et al. | |
| 2005/0001239 | A1 * | 1/2005 | Ishibashi | H01L 31/101 257/202 |
| 2005/0012030 | A1 * | 1/2005 | Mahajan | H01L 31/03046 257/E31.022 |
| 2008/0203425 | A1 * | 8/2008 | Sulima | H01L 31/1105 257/E31.022 |
| 2009/0302307 | A1 * | 12/2009 | Gronninger | H01L 33/06 257/14 |
| 2010/0218819 | A1 * | 9/2010 | Farmer | H01L 31/02167 257/434 |
| 2014/0081150 | A1 * | 3/2014 | Chu | A61B 5/0075 600/478 |
| 2014/0319638 | A1 * | 10/2014 | Chia | H01L 31/107 257/438 |
| 2015/0286078 | A1 * | 10/2015 | Cho | H01L 31/105 359/263 |
| 2015/0287869 | A1 | 10/2015 | Ishibashi et al. | |
| 2016/0172523 | A1 * | 6/2016 | Chacinski | H01L 31/03042 257/184 |
| 2017/0012076 | A1 * | 1/2017 | Chen | H01L 31/035218 |
| 2017/0040477 | A1 * | 2/2017 | Arikata | H01L 31/1844 |
| 2017/0062508 | A1 * | 3/2017 | Na | H01L 31/035281 |
| 2017/0104109 | A1 | 4/2017 | Simoyama | |
| 2018/0138330 | A1 * | 5/2018 | Choi | G06F 30/23 |
| 2018/0331246 | A1 * | 11/2018 | Nada | H01L 31/1075 |
| 2019/0013427 | A1 * | 1/2019 | Ting | H01L 31/101 |
| 2019/0044010 | A1 * | 2/2019 | Arikata | H01L 31/03048 |
| 2019/0181281 | A1 * | 6/2019 | Ritenour | H01L 31/1892 |
| 2019/0280147 | A1 * | 9/2019 | Toyonaka | H01L 31/105 |
| 2021/0242362 | A1 * | 8/2021 | Park | H01L 27/14649 |

FOREIGN PATENT DOCUMENTS

| | | |
|---|---|---|
| EP | 2 808 908 A1 | 12/2014 |
| EP | 2 916 362 A1 | 9/2015 |
| JP | 2012124404 A | 6/2012 |

OTHER PUBLICATIONS

N. Dupuis, D.M. Kuchta, F.E. Doany, A. Rylyakov, J. Proesel, C.W. Baks, and C.L. Schow, "Exploring the limits of high-speed receivers for multimode VCSEL-based optical links", OFC 2014, pp. 1-3, (2014).

G. Lucovsky, R. F. Scharz, and R. B. Emmons, "Transit-time considerations in p-i-n diodes," J. Appl. Phys., vol. 35, pp. 622-628, 1964.

M. S. Alam, M. S. Rahman, M. R. Islam, A. G. Bhuiyan, and M. Yamada, "Refractive Index, Absorption Coefficient, and Photoelastic Constant: Key Parameters of InGaAs Material Relevant to InGaAs-Based Device Performance", 2007 IEEE 19th International Conference on Indium Phosphide & Related Materials, WeA1-3.

D. González, D. Araújo, G. Aragón, and R. García, "Critical thickness for the saturation state of strain relaxation in the InGaAs/GaAs systems", Applied Physics Letters, 72(15), pp. 1875-1877, 1998.

Fay P et al., "Drift-Enhanced Dual-Absorption PIN Photodiodes"; IEEE Photonics Technology Letters, IEEE, USA, vol. 17, No. 7, Jul. 1, 2005 (Jul. 1, 2005), pp. 1513-1515, XP011134960.

Partial European Search Report for European Patent Application No. 22155148.4, dated Jun. 23, 2022, 15 pages.

Extended European Search Report for European Patent Application No. 22155148.4, dated Sep. 28, 2022, (11 pages), European Patent Office, Munich Germany.

Chinese Office Action from corresponding Chinese Application No. 202210078825.X, dated Sep. 28, 2023, 9 pages, with English translation.

* cited by examiner

HIGH MODULATION SPEED PIN-TYPE PHOTODIODE

CROSS-REFERENCE TO RELATED APPLICATIONS

This application claims priority to Greek Application No. 20210100075, filed Feb. 4, 2021, the content of which is hereby incorporated by reference in its entirety.

BACKGROUND

As data communication demands increase in both volume and speed, optical communications have become an increasingly popular communication approach. For optical communications to meet these growing demands, both high speed transmitters and high speed receivers are required.

BRIEF SUMMARY

A photodiode is an electro-optical device configured to receive light through an aperture thereof and convert the light into an electrical signal. An example type of photodiode is a PIN-type photodiode. For example, the PIN-type photodiode may comprise a PIN junction. In general, a PIN junction comprises a P-region within which holes are the majority charge carrier, an intrinsic region within which there are no or minimal free charge carriers, and an N-region within which electrons are the majority charge carrier. The intrinsic region is sandwiched between the P-region and the N-region and acts as an insulator between the P-region and the N-region. For example, the intrinsic region may have a relatively high resistance (compared to the P-region and/or N-region), which may slow the flow of electrons and/or holes therethrough such that the PIN junction acts as a capacitor. In general, the intrinsic region of the PIN-type photodiode comprises the absorption region of the photodiode wherein the light is absorbed by the material of the intrinsic region and converted into electrical charge carriers (e.g., electrons and/or holes). Therefore, a thicker intrinsic region directly corresponds to a more sensitive PIN-type photodiode. However, the thicker the intrinsic region of the PIN-type photodiode, the greater the capacitance of the PIN-type photodiode and, resultantly, the slower the modulation speed of the PIN-type diode. Embodiments of the present invention provide a PIN-type photodiode with appropriate levels of sensitivity for optical communications and an increased modulation speed. For example, various embodiments provide PIN-type photodiodes that have a sensitivity in the range of 0.4 to 0.8 Amps per Watt and a 3-dB modulation bandwidth in the range of 15 to 100 GHz.

Various embodiments provide PIN-type photodiodes comprising multi-layered intrinsic regions. Various embodiments provide PIN-type photodiodes comprising a p-type contact, an n-type contact, and a multi-layered intrinsic region therebetween. In various embodiments, the multi-layered intrinsic region comprises one or more layers of second absorption material embedded within a first absorption material and/or disposed between the first absorption material and one of the contact layers. In various embodiments, the first and second absorption materials are semiconductor materials with the second absorption material having a lower energy bandgap than the first absorption material. In various embodiments, the multi-layered intrinsic region comprises an accelerating layer disposed between the absorption material (e.g., first and/or second absorption material) and one of the contact layers. In various embodiments, the accelerating layer is configured to not absorb light, but to cause photoinduced electrons freed by the absorption of light by the first or second absorption material to have a greater drift speed. In various embodiments, the multi-layered intrinsic region comprises a drift layer disposed between the absorption material (e.g., the first and/or second absorption material) and/or an accelerating layer and the n-type contact. In various embodiments, the drift layer is configured to lower the overall capacitance of the PIN junction of the PIN-type photodiode.

According to an aspect of the present disclosure, a PIN-type photodiode is provided. In an example embodiment, the PIN-type photodiode includes a p-type contact; an n-type contact; a first absorbing layer disposed between the p-type contact and the n-type contact; and a second absorbing layer disposed between the first absorbing layer and the n-type contact. The first absorbing layer is characterized by a first absorption coefficient and the second absorbing layer is characterized by a second absorption coefficient. The second absorption coefficient is greater than the first absorption coefficient.

According to another aspect of the present disclosure, a PIN-type photodiode is provided. In an example embodiment, the PIN-type photodiode includes a p-type contact; an n-type contact; a first absorbing layer disposed between the p-type contact and the n-type contact; and a non-absorbing accelerating layer disposed between the first absorbing layer and the n-type contact.

BRIEF DESCRIPTION OF THE DRAWING(S)

Having thus described the invention in general terms, reference will now be made to the accompanying drawings, which are not necessarily drawn to scale, and wherein:

DETAILED DESCRIPTION OF THE INVENTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "about," "around," etc. are used for explanatory purposes in the examples provided below to describe the relative position of certain components or portions of components. As used herein, the terms "substantially" and "approximately" refer to tolerances within manufacturing and/or engineering standards.

Various embodiments provide a PIN-type photodiode wherein the intrinsic region of the PIN-type photodiode comprises a multi-layered intrinsic region. In various embodiments, the PIN-type photodiode comprises a p-type contact, an n-type contact, and a multi-layered intrinsic region disposed between the p-type contact and the n-type contact. In various embodiments, the multi-layered intrinsic region comprises one or more layers of second absorption material embedded within a first absorption material and/or disposed between the first absorption material and one of the contact layers. In various embodiments, the first and second absorption materials are semiconductor materials with the second absorption material having a lower energy bandgap than the first absorption material. In various embodiments, the multi-layered intrinsic region comprises an accelerating layer disposed between the absorption material (e.g., first and/or second absorption material) and one of the contact layers. In various embodiments, the accelerating layer is configured to not absorb light, but to cause photoinduced electrons freed by the absorption of light by the first or second absorption material to have a greater drift speed. In various embodiments, the multi-layered intrinsic region comprises a drift layer disposed between the absorption material (e.g., first and/or second absorption material) and/or an accelerating layer and the n-type contact. In various embodiments, the drift layer is configured to lower the overall capacitance of the PIN junction of the PIN-type photodiode. FIGS. 1-4 each illustrate a cross-section of an example embodiment of a PIN-type photodiode with the cross-section taken in a plane that comprises an axis defined by the PIN-type diode.

Example PIN-Type Photodiode 100

Figure 1:
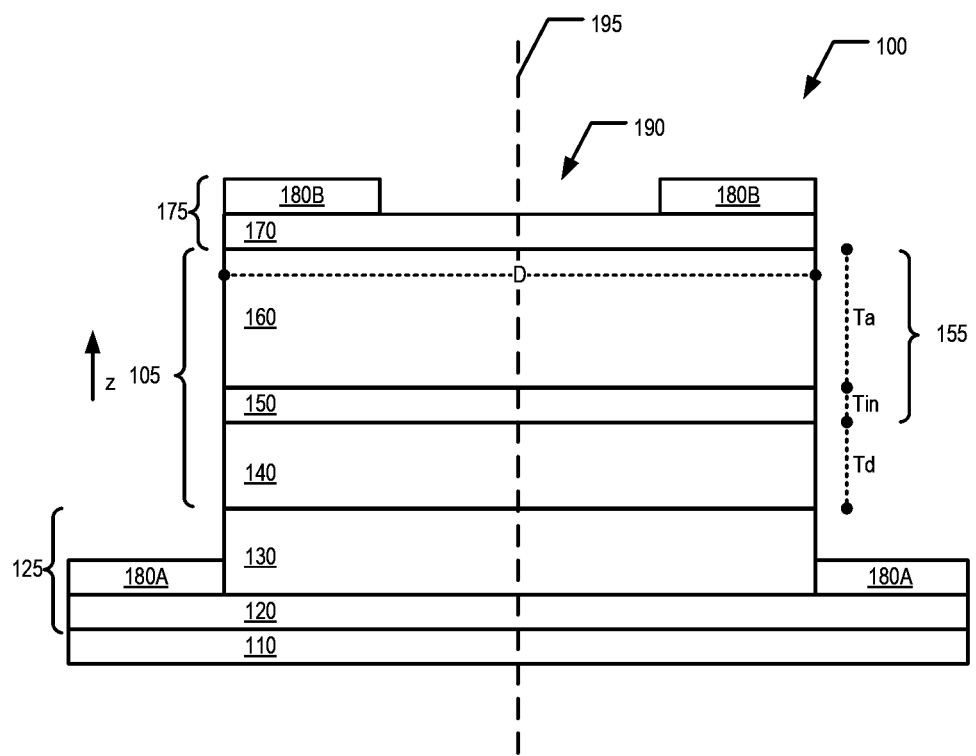
FIG. 1 illustrates a cross-section of an example PIN-type photodiode, in accordance with an example embodiment.

FIG. 1 illustrates a cross-section of a PIN-type photodiode 100 taken in a plane that comprises the axis 195 of the PIN-type photodiode 100, according to an example embodiment. In various embodiments, the PIN-type photodiode 100 may be substantially uniform in various planes taken substantially perpendicularly to the axis 195. In other words, the composition and/or features of the PIN-type photodiode 100 may be generally the same along a first radius extending out from the axis 195 and along a second, different radius extending out from the axis 195 in a same plane as the first radius, the plane being substantially perpendicular to the axis 195.

In various embodiments, the PIN-type photodiode 100 comprises a multi-layered intrinsic region 105 that comprises two absorption layers that are characterized by different absorption coefficients. In various embodiments, the PIN-type photodiode 100 is formed on and/or mounted on a substrate 110. In various embodiments, the substrate 110 comprises a GaAs substrate or other appropriate substrate.

In various embodiments, the PIN-type photodiode 100 comprises a p-type contact 175 and an n-type contact 125. For example, the p-type contact 175 may comprise a p-type semiconductor contact layer 170 and an anode electrode and/or pad 180B. For example, the n-type contact 125 may comprise an n-type contact layer 120, an n-type semiconductor contact layer 130, and a cathode electrode and/or pad 180A. In various embodiments, the electrodes and/or pads 180A, 180B are formed by depositing and/or patterning conductive material onto the PIN-type photodiode. For example, the electrodes and/or pads 180A, 180B may comprise copper, gold, and/or other metal. In various embodiments, the n-type contact layer 120 is made of a conductive material such as copper, gold, or other metal. In various embodiments, the n-type semiconductor contact layer 130 comprises a semiconductor material that has been doped with an n-type dopant. For example, the n-type semiconductor contact layer 130 may comprise n-type doped AlGaAs. In various embodiments, the p-type semiconductor contact layer 170 comprises a semiconductor material that has been doped with a p-type dopant. For example, the p-type semiconductor contact layer 170 may comprise p-type doped AlGaAs. In various embodiments, the PIN-type photodiode comprises a mesa structure having a diameter D. One of the cathode electrode and/or pad 180A or anode electrode and/or pad 180B may be disposed on the top of the mesa structure and around (e.g., defining) an aperture 190, and the other of the cathode electrode and/or pad 180A or anode electrode and/or pad 180B may be disposed about and/or around the mesa structure. In various embodiments, the diameter D is in a range of ten to forty microns (e.g., twenty to thirty microns).

In various embodiments, the PIN-type photodiode 100 comprises a multi-layered intrinsic region 105. In various embodiments, the multi-layered intrinsic region 105 comprises the absorption region 155 of the PIN-type photodiode 100. In various embodiments, the absorption region 155 comprises at least one absorption material configured to absorb light of a particular wavelength range. As shown in FIG. 1, when the axis 195 defined by the PIN-type photodiode 100 is aligned with the z-axis, light (e.g., of the particular wavelength range) may enter the PIN-type photodiode 100 through the aperture 190 traveling in a negative z-direction and be absorbed by the absorption material of the intrinsic region. When a photon of the particular wavelength is absorbed, a photoinduced electron is freed from the crystalline structure of the absorption material, thereby providing a photoinduced electron and a hole. The hole moves generally in the positive z-direction toward the p-type contact and the photoinduced electron moves generally in the negative z-direction toward the n-type contact when a negative reverse bias is applied between p- and n-contacts of PIN-type photodiode 100. The hole reaching the p-type contact and/or the photoinduced electron reaching the n-type contact causes a voltage difference and/or current flow at the electrodes and/or pads 180A, 180B.

In various embodiments, the multi-layered intrinsic region 105 comprises a drift layer 140. In various embodiments, the drift layer 140 is configured to not absorb light of the particular wavelength range. For example, the drift layer 140 may be a non-absorbing drift layer. In various embodiments, the drift layer 140 is disposed between the absorbing region of the multi-layered intrinsic region 105 and the n-type contact 125 (e.g., n-type semiconductor contact layer 130). In particular, the PIN-type photodiode may be configured such that only the photoinduced electrons pass across the drift layer 140. For example, the PIN-type photodiode may be configured such that the holes do not cross the drift layer 140. For example, the drift layer 140 may be disposed at the boundary of the multi-layered intrinsic region 105 that abuts and/or directly borders the n-type contact 125.

In various embodiments, the drift layer 140 is configured to reduce the capacitance of the PIN junction of the PIN-type photodiode while having a minimal effect on the transit time for the photoinduced electrons. In general, the transit time for a photoinduced electron is the time between when the photoinduced electron is generated and when the photoinduced electron reaches the n-type contact 125. The shorter the transit time for the photoinduced electrons for the PIN-type photodiode, the faster the PIN-type photodiode can be modulated. In various embodiments, the drift layer comprises a material that provides for high mobility of the photoinduced electrons traveling therethrough.

In various embodiments, the drift layer 140 comprises a semiconductor material having a band gap energy such that the drift layer 140 essentially functions as a carrier transport layer. For example, the band gap energy of the drift layer 140 may be larger than the band gap energy of the absorption material (e.g., the first and/or second absorption material). In particular, the band gap energy of the drift layer 140 may be sufficiently large such as to prevent, or at least substantially reduce, the absorption of light of the particular wavelength range by the drift layer 140. In the illustrated embodiment, the drift layer 140 comprises an intrinsic or lightly n-type doped AlGaAs ($Al_xGa_{1-x}As$, x=(0 . . . 1)) compound semiconductor alloy. For example, the drift layer 140 may substantially undoped. In an example embodiment, the drift layer 140 has a thickness (e.g., in a direction substantially parallel to the axis 195) $T_d$ in the range of sub microns. For example, in an example embodiment, the drift layer 140 has a thickness $T_d$ in the range of 0.1 to 0.5 microns (e.g., 0.3 microns). The particular thickness to be used depends on the relative thicknesses of the other layers, in particular, the absorption layers 150, 160, and may be customized depending on the desired characteristics for the PIN-type photodiode 100.

In various embodiments, the drift layer 140 is configured such that the electric field in the drift layer 140 is lower than the electric field in the absorption layers 150, 160. In various embodiments, the reduction of electric field in the drift layer 140 with respect to the absorption layers 150, 160 is realized by the distribution of the dopant concentration in the absorption layers 150, 160 and the drift layer 140 and any buffer layer therebetween. In an example embodiment, the electric field in the drift layer 140 is reduced by n-type doping a region of the drift layer 140 adjacent to the absorption layers 150, 160 and/or providing an n-type doped buffer layer between the drift layer 140 and the second absorption layer 150. This doped region may be substantially thinner than the drift layer 140. In various embodiments, a thinner doped region will require higher doping levels, while a thicker region will require lower doping levels to achieve the desired reduction of the electric field in the drift layer 140. As should be understood, the main factor for achieving a particular reduction of the electric field in the drift layer 140 is the total fixed specific charge due to the n-type dopant introduced in a doped region of the drift layer 140 and/or a buffer layer between the drift layer 140 and the second absorption layer 150.

In various embodiments, the multi-layered intrinsic region 105 comprises an absorption region 155 comprising a first absorption layer 160 and a second absorption layer 150. In various embodiments, the first absorption layer 160 is configured to absorb light of the particular wavelength range. In various embodiments, the first absorption layer 160 has a thickness $T_a$ in a direction that is substantially parallel to the axis 195. In various embodiments, the first absorption layer 160 comprises a first absorption material. In an example embodiment, the first absorption material is a semiconductor material configured to absorb light of the particular wavelength range. For example, the particular wavelength range may comprise the range 800-900 nm and/or a portion thereof and the first absorption material may be GaAs.

In various embodiments, the second absorption layer 150 is configured to absorb light of the particular wavelength range. In various embodiments, the second absorption layer 150 has a thickness $T_{in}$ in a direction that is substantially parallel to the axis 195. In various embodiments, the second absorption layer 150 comprises second absorption material. In an example embodiment, the second absorption material is a semiconductor material configured to absorb light of the particular wavelength range. For example, the particular wavelength range may comprise the range 800-900 nm and/or a portion thereof and the second absorption material may be InGaAs (e.g., $In_yGa_{1-y}As$, y=(0 . . . 1)). In various embodiments, the second absorption material has a lower band gap energy than the first absorption material. In various embodiments, the second absorption material has a higher absorption coefficient than the first absorption material. For example, the first absorption layer 160 may be characterized by a first absorption coefficient and the second absorption layer 150 may be characterized by a second absorption coefficient, with the second absorption coefficient being greater than the first absorption coefficient. In various embodiments, the thickness $T_{in}$ of the second absorption layer 150 is less than the thickness $T_a$ of the first absorption layer 160. In an example embodiment, the thickness $T_{in}$ of the second absorption layer 150 may have an upper boundary defined by the strain relaxation of the first absorption material crystal lattice constant. For example, when the first absorption material is GaAs and the second absorption material is InGaAs, the thickness $T_{in}$ of the second absorption layer 150 may be equal to or less than a critical thickness governed and/or controlled by the saturation of the strain relaxation of the host GaAs crystal lattice constant corresponding to the amount of Indium added to the GaAs to form the InGaAs. In an example embodiment, the thickness of the absorbing region ($T_a+T_{in}$) may be in the range of half to two microns (e.g., 0.8 to 1.8 microns and/or approximately 1.3 microns).

In various embodiments, the second absorbing layer 150 is disposed and/or formed on a boundary of the absorbing region that abuts and/or directly borders the drift layer 140 (or in an embodiment not comprising a drift layer 140, the n-type contact 125). Thus, due to the higher absorption coefficient of the second absorbing layer 150, this positioning of the second absorbing layer 150 may increase the fraction of photoinduced electrons provided to the n-type semiconductor contact layer 130 in a relatively short period of time such that the transit time of photoinduced electrons for the PIN-type photodiode 100 is decreased while increasing the 3-dB modulation bandwidth of the PIN-type photodiode.

Example PIN-Type Photodiode 200

Figure 2:
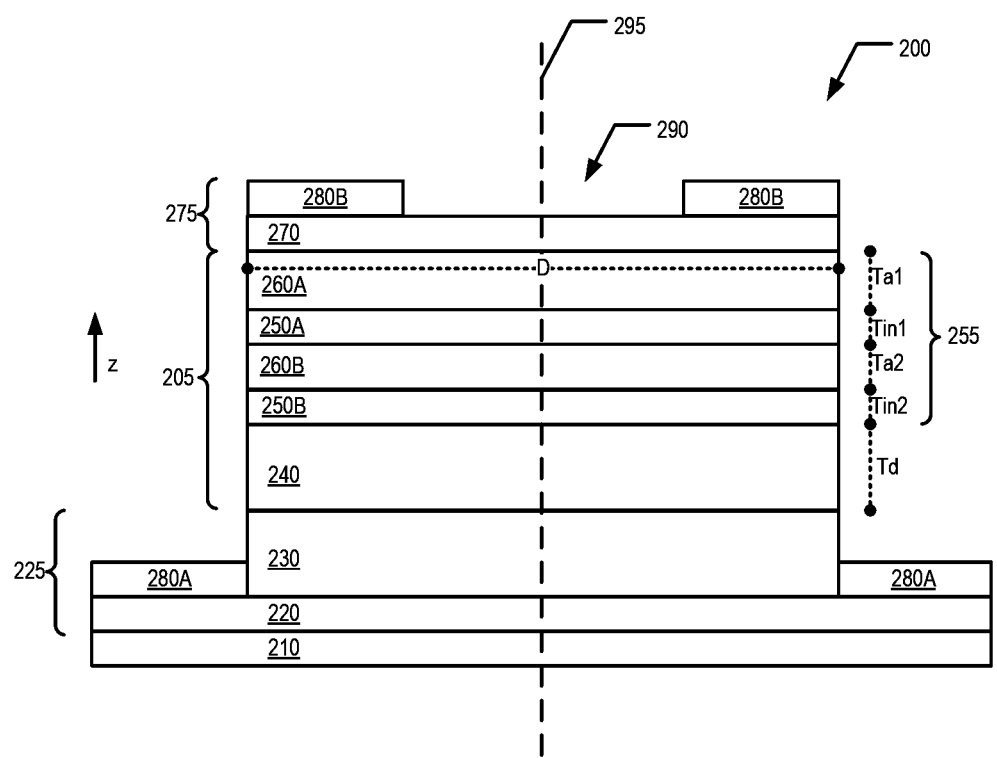
FIG. 2 illustrates a cross-section of an example PIN-type photodiode, in accordance with another example embodiment.

FIG. 2 illustrates a cross-section of a PIN-type photodiode 200 taken in a plane that comprises the axis 295 of the PIN-type photodiode 200, according to an example embodiment. In various embodiments, the PIN-type photodiode 200 may be substantially uniform in various planes taken substantially perpendicularly to the axis 295. In other words, the composition and/or features of the PIN-type photodiode 200 may be generally the same along a first radius extending out from the axis 295 and along a second, different radius extending out from the axis 295 in a same plane as the first radius, the plane being substantially perpendicular to the axis 295.

In various embodiments, the PIN-type photodiode 200 comprises a multi-layered intrinsic region 205 comprising a plurality (e.g., four or more) absorption layers with adjacent absorption layers characterized by different absorption coefficients. In various embodiments, the PIN-type photodiode 200 is formed on and/or mounted on a substrate 210. In various embodiments, the substrate 210 comprises a GaAs substrate or other appropriate substrate.

In various embodiments, the PIN-type photodiode 200 comprises a p-type contact 275 and an n-type contact 225. For example, the p-type contact 275 may comprise a p-type semiconductor contact layer 270 and an anode electrode and/or pad 280B. For example, the n-type contact 225 may comprise an n-type contact layer 220, an n-type semiconductor contact layer 230, and a cathode electrode and/or pad 280A. In various embodiments, the electrodes and/or pads 280A, 280B are formed by depositing and/or patterning conductive material onto the PIN-type photodiode. For example, the electrodes and/or pads 280A, 280B may comprise copper, gold, and/or other metal. In various embodiments, the n-type contact layer 220 is made of a conductive material such as copper, gold, or other metal. In various embodiments, the n-type semiconductor contact layer 230 comprises a semiconductor material that has been doped with an n-type dopant. For example, the n-type semiconductor contact layer 230 may comprise n-type doped AlGaAs. In various embodiments, the p-type semiconductor contact layer 270 comprises a semiconductor material that has been doped with a p-type dopant. For example, the p-type semiconductor contact layer 270 may comprise p-type doped AlGaAs. In various embodiments, the PIN-type photodiode comprises a mesa structure having a diameter D. One of the cathode electrode and/or pad 280A or anode electrode and/or pad 280B may be disposed on the top of the mesa structure and around (e.g., defining) an aperture 290, and the other of the cathode electrode and/or pad 280A or anode electrode and/or pad 280B may be disposed about and/or around the mesa structure. In various embodiments, the diameter D is in a range of ten to forty microns (e.g., twenty to thirty microns).

In various embodiments, the PIN-type photodiode 200 comprises a multi-layered intrinsic region 205. In various embodiments, the multi-layered intrinsic region 205 comprises the absorption region 255 of the PIN-type photodiode 200. In various embodiments, the absorption region 255 comprises absorption material configured to absorb light of a particular wavelength range. As shown in FIG. 2, when the axis 295 defined by the PIN-type photodiode 200 is aligned with the z-axis, light (e.g., of the particular wavelength range) may enter the PIN-type photodiode 200 through the aperture 290 traveling in a negative z-direction and be absorbed by the absorption material of the intrinsic region. When a photon of the particular wavelength is absorbed, a photoinduced electron is freed from the crystalline structure of the absorption material, thereby providing a photoinduced electron and a hole. The hole moves generally in the positive z-direction toward the p-type contact 275 and the photoinduced electron moves generally in the negative z-direction toward the n-type contact 225. The hole reaching the p-type contact 275 and/or the photoinduced electron reaching the n-type contact 225 causes a voltage difference and/or current flow at the electrodes and/or pads 280A, 280B.

In various embodiments, the multi-layered intrinsic region 205 comprises a drift layer 140. In various embodiments, the drift layer 240 is configured to not absorb light of the particular wavelength range. For example, the drift layer 240 may be a non-absorbing drift layer. In various embodiments, the drift layer 240 is disposed between the absorbing region of the multi-layered intrinsic region 205 and the n-type contact 225 (e.g., n-type semiconductor contact layer 230). In particular, the PIN-type photodiode may be configured such that only the photoinduced electrons pass across the drift layer 240. For example, the PIN-type photodiode may be configured such that the holes do not cross the drift layer 240. For example, the drift layer 240 may be disposed at the boundary of the multi-layered intrinsic region 205 that abuts and/or directly borders the n-type contact 225.

In various embodiments, the drift layer 240 is configured to reduce the capacitance of the PIN junction of the PIN-type photodiode while having a minimal effect on the transit time for the photoinduced electrons. In general, the transit time for a photoinduced electron is the time between when the photoinduced electron is generated and when the photoinduced electron reaches the n-type contact 225. The shorter the transit time for the photoinduced electrons for the PIN-type photodiode, the faster the PIN-type photodiode can be modulated. In various embodiments, the drift layer comprises a material that provides for high mobility of the photoinduced electrons traveling therethrough.

In various embodiments, the drift layer 240 comprises a semiconductor material having a band gap energy such that the drift layer 240 essentially functions as a carrier transport layer. For example, the band gap energy of the drift layer 240 may be larger than the band gap energy of the absorption material (e.g., the first and/or second absorption material). In particular, the band gap energy of the drift layer 240 may be sufficiently large such as to prevent, or at least substantially reduce, the absorption of light of the particular wavelength range by the drift layer 240. In the illustrated embodiment, the drift layer 240 comprises an intrinsic or lightly n-type doped AlGaAs ($Al_xGa_{1-x}As$, x=(0 . . . 1)) compound semiconductor alloy. For example, the drift layer 240 may substantially undoped. In an example embodiment, the drift layer 240 has a thickness (e.g., in a direction substantially parallel to the axis 295) $T_d$ in the range of half a micron to ten microns. For example, in an example embodiment, the drift layer $T_d$ in the range of sub microns. For example, in an example embodiment, the drift layer 240 has a thickness $T_d$ in the range of 0.1 to 0.5 microns (e.g., 0.3 microns). The particular thickness to be used depends on the relative thicknesses of the other layers, in particular, the absorption layers 250, 260, and may be customized depending on the desired characteristics for the PIN-type photodiode 200.

In various embodiments, the drift layer 240 is configured such that the electric field in the drift layer 240 is lower than the electric field in the absorption layers 250, 260. In various embodiments, the reduction of electric field in the drift layer 240 with respect to the absorption layers 250, 260 is realized by the distribution of the dopant concentration in the absorption layers 250, 260 and the drift layer 240 and any buffer layer therebetween. In an example embodiment, the electric field in the drift layer 240 is reduced by n-type doping a region of the drift layer 240 adjacent to the absorption layers 250, 260 and/or providing an n-type doped buffer layer between the drift layer 240 and the second absorption layer 250. This doped region may be substantially thinner than the drift layer 240. In various embodiments, a thinner doped region will require higher doping levels, while a thicker region will require lower doping levels to achieve the desired reduction of the electric field in the drift layer 240. As should be understood, the main factor for achieving a particular reduction of the electric field in the drift layer 240 is the total fixed specific charge due to the n-type dopant introduced in a doped region of the drift layer 240 and/or a buffer layer between the drift layer 240 and the second absorption layer 250.

In various embodiments, the multi-layered intrinsic region 205 comprises two or more groups of absorption layers. Each group of absorption layers comprises first absorption layer 260A, 260B and a second absorption layer 250A, 250B. For example, one first absorption layer 260A and one second absorption layer 250A form a first group of absorption layers, and another first absorption layer 260B and another second absorption layer 250B form a second group of absorption layers. In various embodiments, each first absorption layer 260A, 260B is configured to absorb light of the particular wavelength range. In various embodiments, the one first absorption layer 260A has a thickness $T_{a1}$ in a direction that is substantially parallel to the axis 295 and the other first absorption layer 260B has a thickness $T_{a2}$ in a direction that is substantially parallel to the axis 295. In various embodiments, $T_{a1}$ and $T_{a2}$ may be equal to one another, $T_{a2}$ may be greater than $T_{a1}$, or $T_{a1}$ may be greater than $T_{a2}$, as appropriate for the application. In various embodiments, each first absorption layer 260A, 260B comprises a first absorption material. In an example embodiment, the first absorption material is a semiconductor material configured to absorb light of the particular wavelength range. For example, the particular wavelength range may comprise the range 800-900 nm and/or a portion thereof and the first absorption material may be GaAs.

In various embodiments, each second absorption layer 250A, 250B is configured to absorb light of the particular wavelength range. In various embodiments, the one second absorption layer 250A has a thickness $T_{in1}$ in a direction that is substantially parallel to the axis 295 and the other second absorption layer 250B has a thickness $T_{in2}$ in a direction that is substantially parallel to the axis 195. In various embodiments, $T_{in1}$ and $T_{in2}$ may be equal to one another, $T_{in2}$ may be greater than $T_{in1}$, or $T_{in1}$ may be greater than $T_{in2}$, as appropriate for the application. In various embodiments, each second absorption layer 250A, 250B comprises a second absorption material. In an example embodiment, the second absorption material is a semiconductor material configured to absorb light of the particular wavelength range. For example, the particular wavelength range may comprise the range 800-900 nm and/or a portion thereof and the second absorption material may be InGaAs (e.g., $In_yGa_{1-y}As$, y=(0 . . . 1)). In various embodiments, the second absorption material has a lower band gap energy than the first absorption material. In various embodiments, the second absorption material has a higher absorption coefficient than the first absorption material. For example, the first absorption layers 260A, 260B may be characterized by a first absorption coefficient and the second absorption layers 250A, 250B may be characterized by a second absorption coefficient, with the second absorption coefficient being greater than the first absorption coefficient. In various embodiments, the thickness $T_{in1}$, $T_{in2}$ of the second absorption layers 250A, 250B is less than the thickness $T_{a1}$, $T_{a2}$ of the first absorption layer 260A, 260B of the same group of absorption layers. In an example embodiment, the thickness $T_{in1}$, $T_{in2}$ of each of the second absorption layers 250A, 250B is less than the thickness $T_{a1}$, $T_{a2}$ of each of the first absorption layers 260A, 260B. In various embodiments, the specific location of the one second absorbing layer 250A (e.g., as defined by the thicknesses $T_{a1}$, $T_{a2}$ of the first absorption layers 260A, 260B) may be configured to balance the local concentration of photoinduced electron and holes and their shortest transit times to the n-type contact 225 and the p-type contact 275, respectively.

In an example embodiment, the thickness $T_{in1}$, $T_{in2}$ of each of the second absorption layers 250A, 250B or the total thickness of the second absorption layers 250A, 250B ($T_{in1}$+ $T_{in2}$) may have an upper boundary defined by the strain relaxation of the first absorption material crystal lattice constant. For example, when the first absorption material is GaAs and the second absorption material is InGaAs, the thickness $T_{in1}$, $T_{in2}$ of the second absorption layers 250A, 250B may be equal to or less than a critical thickness governed and/or controlled by the saturation of the strain relaxation of the host GaAs crystal lattice constant corresponding to the amount of Indium added to the GaAs to form the InGaAs. In an example embodiment, the thickness of the absorbing region ($T_{a1}$+$T_{in1}$+$T_{a2}$+$T_{in2}$) may be in the range of half to two microns (e.g., 0.8 to 1.8 microns and/or approximately 1.3 microns).

In various embodiments, one of the second absorbing layers (e.g., the second absorbing layer 250B) is disposed and/or formed on a boundary of the absorbing region that abuts and/or directly borders the drift layer 240 (or in an embodiment not comprising a drift layer 240, the n-type contact 225). The other second absorbing layers (e.g., the second absorbing layer 250A) may be sandwiched between the two first absorbing layers 260A, 260B. For example, the absorbing region may comprise alternating layers of first absorbing layers and second absorbing layers. For example, each first absorbing layer may abut, neighbor, and/or be directly adjacent to either (a) the p-type contact 275 and one second absorbing layer or (b) two second absorbing layers. For example, each second absorbing layer may abut, neighbor, and/or be directly adjacent to either (a) two first absorbing layers or (b) the drift layer 240 or n-type contact 225 and one first absorbing layer. Thus, the second absorbing layer 250B may increase the fraction of photoinduced electrons provided to the n-type semiconductor contact layer 230 in a relatively short period of time such that the transit time of photoinduced electrons for the PIN-type photodiode 200 is decreased while increasing the 3-dB modulation bandwidth of the PIN-type photodiode.

Example PIN-Type Photodiode 300

Figure 3:
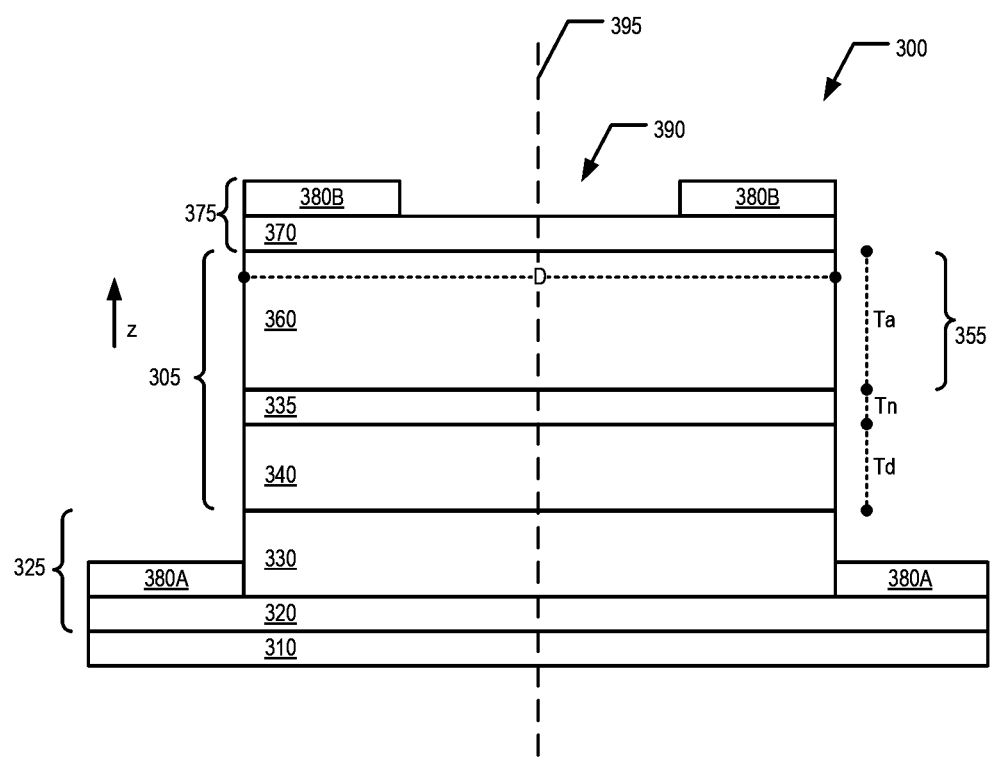
FIG. 3 illustrates a cross-section of an example PIN-type photodiode, in accordance with yet another example embodiment.

FIG. 3 illustrates a cross-section of a PIN-type photodiode 300 taken in a plane that comprises the axis 395 of the PIN-type photodiode 300, according to an example embodiment. In various embodiments, the PIN-type photodiode 300 may be substantially uniform in various planes taken substantially perpendicularly to the axis 395. In other words, the composition and/or features of the PIN-type photodiode 300 may be generally the same along a first radius extending out from the axis 395 and along a second, different radius extending out from the axis 395 in a same plane as the first radius, the plane being substantially perpendicular to the axis 395.

In various embodiments, the PIN-type photodiode 300 comprises a multi-layered intrinsic region 305 that comprises an accelerating layer 335. In various embodiments, the PIN-type photodiode 300 is formed on and/or mounted on a substrate 310. In various embodiments, the substrate 310 comprises a GaAs substrate or other appropriate substrate.

In various embodiments, the PIN-type photodiode 300 comprises a p-type contact 375 and an n-type contact 325. For example, the p-type contact 375 may comprise a p-type semiconductor contact layer 370 and an anode electrode and/or pad 380B. For example, the n-type contact 325 may comprise an n-type contact layer 320, an n-type semiconductor contact layer 330, and a cathode electrode and/or pad 380A. In various embodiments, the electrodes and/or pads 380A, 380B are formed by depositing and/or patterning conductive material onto the PIN-type photodiode. For example, the electrodes and/or pads 380A, 380B may comprise copper, gold, and/or other metal. In various embodiments, the n-type contact layer 320 is made of a conductive material such as copper, gold, or other metal. In various embodiments, the n-type semiconductor contact layer 330 comprises a semiconductor material that has been doped with an n-type dopant. For example, the n-type semiconductor contact layer 330 may comprise n-type doped AlGaAs. In various embodiments, the p-type semiconductor contact layer 370 comprises a semiconductor material that has been doped with a p-type dopant. For example, the p-type semiconductor contact layer 370 may comprise p-type doped AlGaAs. In various embodiments, the PIN-type photodiode comprises a mesa structure having a diameter D. One of the cathode electrode and/or pad 380A or anode electrode and/or pad 380B may be disposed on the top of the mesa structure and around (e.g., defining) an aperture 390, and the other of the cathode electrode and/or pad 380A or anode electrode and/or pad 380B may be disposed about and/or around the mesa structure. In various embodiments, the diameter D is in a range of ten to forty microns (e.g., twenty to thirty microns).

In various embodiments, the PIN-type photodiode 300 comprises a multi-layered intrinsic region 305. In various embodiments, the multi-layered intrinsic region 305 comprises the absorption region 355 of the PIN-type photodiode 300. In various embodiments, the absorption region 355 comprises at least one absorption material configured to absorb light of a particular wavelength range. As shown in FIG. 3, when the axis 395 defined by the PIN-type photodiode 300 is aligned with the z-axis, light (e.g., of the particular wavelength range) may enter the PIN-type photodiode 300 through the aperture 390 traveling in a negative z-direction and be absorbed by the absorption material of the intrinsic region. When a photon of the particular wavelength is absorbed, a photoinduced electron is freed from the crystalline structure of the absorption material, thereby providing a photoinduced electron and a hole. The hole moves generally in the positive z-direction toward the p-type contact and the photoinduced electron moves generally in the negative z-direction toward the n-type contact. The hole reaching the p-type contact and/or the photoinduced electron reaching the n-type contact causes a voltage difference and/or current flow at the electrodes and/or pads 380A, 380B.

In various embodiments, the multi-layered intrinsic region 305 comprises a drift layer 340. In various embodiments, the drift layer 340 is configured to not absorb light of the particular wavelength range. For example, the drift layer 340 may be a non-absorbing drift layer. In various embodiments, the drift layer 340 is disposed between the absorbing region of the multi-layered intrinsic region 305 and the n-type contact 325 (e.g., n-type semiconductor contact layer 330). In particular, the PIN-type photodiode may be configured such that only the photoinduced electrons pass across the drift layer 340. For example, the PIN-type photodiode may be configured such that the holes do not cross the drift layer 340. For example, the drift layer 340 may be disposed at the boundary of the multi-layered intrinsic region 305 that abuts and/or directly borders the n-type contact 325.

In various embodiments, the drift layer 340 is configured to reduce the capacitance of the PIN junction of the PIN-type photodiode while having a minimal effect on the transit time for the photoinduced electrons. In general, the transit time for a photoinduced electron is the time between when the photoinduced electron is generated and when the photoinduced electron reaches the n-type contact 325. The shorter the transit time for the photoinduced electrons for the PIN-type photodiode, the faster the PIN-type photodiode can be modulated. In various embodiments, the drift layer comprises a material that provides for high mobility of the photoinduced electrons traveling therethrough.

In various embodiments, the drift layer 340 comprises a semiconductor material having a band gap energy such that the drift layer 340 essentially functions as a carrier transport layer. For example, the band gap energy of the drift layer 340 may be larger than the band gap energy of the absorption material (e.g., the first and/or second absorption material). In particular, the band gap energy of the drift layer 340 may be sufficiently large such as to prevent, or at least substantially reduce, the absorption of light of the particular wavelength range by the drift layer 340. In the illustrated embodiment, the drift layer 340 comprises an intrinsic or lightly n-type doped AlGaAs ($Al_xGa_{1-x}As$, x=(0 . . . 1)) compound semiconductor alloy. For example, the drift layer 340 may substantially undoped. In an example embodiment, the drift layer 340 has a thickness (e.g., in a direction substantially parallel to the axis 395) $T_d$ in the range of sub microns. For example, in an example embodiment, the drift layer 340 has a thickness $T_d$ in the range of 0.1 to 0.5 microns (e.g., 0.3 microns). The particular thickness to be used depends on the relative thicknesses of the other layers, in particular, the absorption layer 360, and may be customized depending on the desired characteristics for the PIN-type photodiode 300.

In various embodiments, the drift layer 340 is configured such that the electric field in the drift layer 340 is lower than the electric field in the absorption layer 360. In various embodiments, the reduction of electric field in the drift layer 340 with respect to the absorption layer 360 is realized by the distribution of the dopant concentration in the absorption layer 360 and the drift layer 340 and any buffer layer therebetween. In an example embodiment, the electric field in the drift layer 340 is reduced by n-type doping a region of the drift layer 340 adjacent to the absorption layer 360 and/or providing an n-type doped butler layer between the drift layer 340 and the absorption layer 360. This doped region may be substantially thinner than the drift layer 340. In various embodiments, a thinner doped region will require higher doping levels, while a thicker region will require lower doping levels to achieve the desired reduction of the electric field in the drift layer 340. As should be understood, the main factor for achieving a particular reduction of the electric field in the drift layer 340 is the total fixed specific charge due to the n-type dopant introduced in a doped region of the drift layer 340 and/or a buffer layer between the drift layer 340 and the absorption layer 360.

In various embodiments, the multi-layered intrinsic region 305 comprises an absorption layer 360. In various embodiments, the absorption layer 360 is configured to absorb light of the particular wavelength range. In various embodiments, the absorption layer 360 has a thickness $T_a$ in a direction that is substantially parallel to the axis 395. In various embodiments, the absorption layer 360 comprises a first absorption material. In an example embodiment, the first absorption material is a semiconductor material configured to absorb light of the particular wavelength range. For example, the particular wavelength range may comprise the range 800-900 nm and/or a portion thereof and the first absorption material may be GaAs. In various embodiments, the absorption layer 360 is characterized by a first absorption coefficient.

In various embodiments, the multi-layered intrinsic region 305 further comprises accelerating layer 335. In various embodiments, the accelerating layer 335 is configured to not absorb light in the particular wavelength range. For example, the accelerating layer 335 may be a non-absorbing accelerating layer. In various embodiments, the accelerating layer is configured to cause photoinduced electrons freed by the absorption of light by the first or second absorption material to have a greater drift speed. In various embodiments, the accelerating layer is disposed between the absorbing layer 360 and the drift layer 340 (or the n-type contact 325 in embodiments not including a drift layer 340).

In an example embodiment, the accelerating layer 335 comprises n-type doped AlGaAs (e.g., $Al_zGa_{1-z}As$, z=(0 . . . 1)). In an example embodiment, the accelerating layer 335 comprises n-type doped AlGaAs that comprises a concentration of an n-type dopant in a range of $1\times10^{15}$ to $1\times10^{17}$ per cubic centimeter. In various embodiments, the accelerating layer 335 has a thickness $T_n$ in a direction that is substantially parallel to the axis 395.

In various embodiments, the accelerating layer 335 causes the electric field within the absorbing layer 360 to be increased such that the drift velocity of photoinduced electrons is higher when the electrons are freed from the crystalline structure of the absorbing material. As the drift velocity of the photoinduced electrons is higher, the time it takes for the photoinduced electrons to reach the n-type contact 325 is lower. Thus, the accelerating layer 335 decreases the transit time of photoinduced electrons for the PIN-type photodiode 300 while increasing the 3-dB modulation bandwidth of the PIN-type photodiode.

Example PIN-Type Photodiode 400

Figure 4:
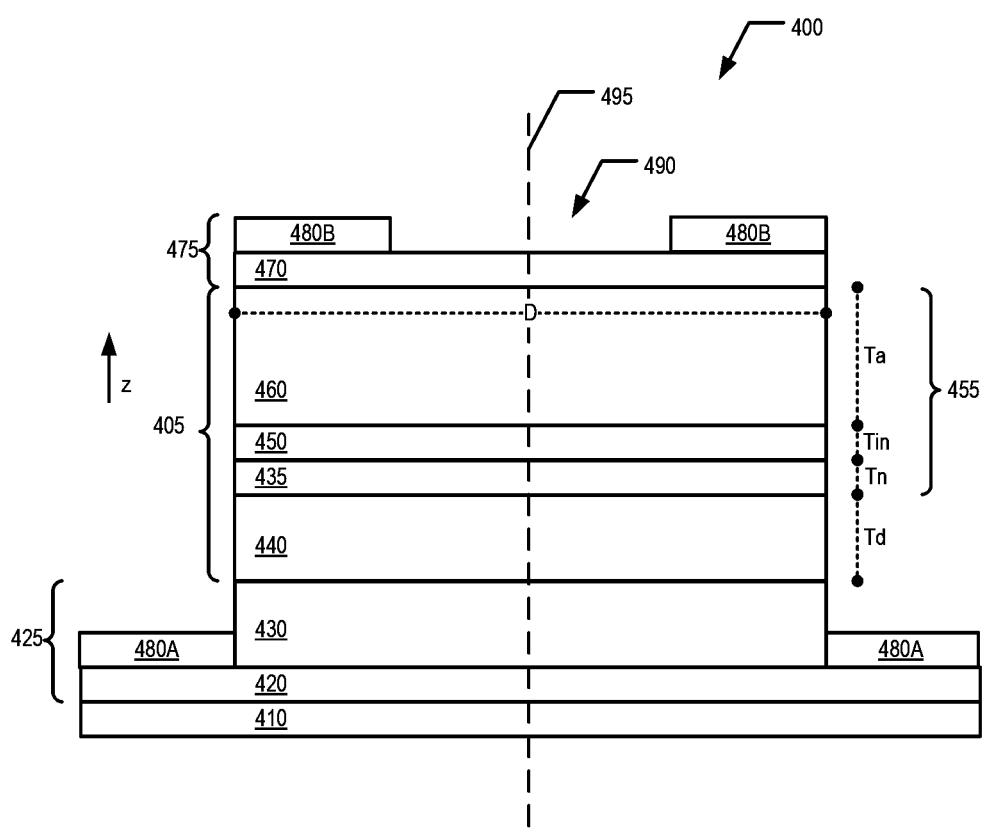
FIG. 4 illustrates a cross-section of an example PIN-type photodiode, in accordance with still another example embodiment.

FIG. 4 illustrates a cross-section of a PIN-type photodiode 400 taken in a plane that comprises the axis 495 of the PIN-type photodiode 400, according to an example embodiment. In various embodiments, the PIN-type photodiode 400 may be substantially uniform in various planes taken substantially perpendicularly to the axis 495. In other words, the composition and/or features of the PIN-type photodiode 400 may be generally the same along a first radius extending out from the axis 495 and along a second, different radius extending out from the axis 495 in a same plane as the first radius, the plane being substantially perpendicular to the axis 495.

In various embodiments, the PIN-type photodiode 400 comprises a multi-layered intrinsic region 405 that comprises an accelerating layer 435 and multiple absorbing layers 450, 460. In various embodiments, the PIN-type photodiode 400 is formed on and/or mounted on a substrate 410. In various embodiments, the substrate 410 comprises a GaAs substrate or other appropriate substrate.

In various embodiments, the PIN-type photodiode 400 comprises a p-type contact 475 and an n-type contact 425. For example, the p-type contact 475 may comprise a p-type semiconductor contact layer 470 and an anode electrode and/or pad 480B. For example, the n-type contact 425 may comprise an n-type contact layer 420, an n-type semiconductor contact layer 430, and a cathode electrode and/or pad 480A. In various embodiments, the electrodes and/or pads 480A, 480B are formed by depositing and/or patterning conductive material onto the PIN-type photodiode. For example, the electrodes and/or pads 480A, 480B may comprise copper, gold, and/or other metal. In various embodiments, the n-type contact layer 420 is made of a conductive material such as copper, gold, or other metal. In various embodiments, the n-type semiconductor contact layer 430 comprises a semiconductor material that has been doped with an n-type dopant. For example, the n-type semiconductor contact layer 430 may comprise n-type doped AlGaAs. In various embodiments, the p-type semiconductor contact layer 470 comprises a semiconductor material that has been doped with a p-type dopant. For example, the p-type semiconductor contact layer 470 may comprise p-type doped AlGaAs. In various embodiments, the PIN-type photodiode comprises a mesa structure having a diameter D. One of the cathode electrode and/or pad 480A or anode electrode and/or pad 480B may be disposed on the top of the mesa structure and around (e.g., defining) an aperture 490, and the other of the cathode electrode and/or pad 480A or anode electrode and/or pad 480B may be disposed about and/or around the mesa structure. In various embodiments, the diameter D is in a range of ten to forty microns (e.g., twenty to thirty microns).

In various embodiments, the PIN-type photodiode 400 comprises a multi-layered intrinsic region 405. In various embodiments, the multi-layered intrinsic region 405 comprises the absorption region 455 of the PIN-type photodiode 400. In various embodiments, the absorption region 455 comprises at least one absorption material configured to absorb light of a particular wavelength range. As shown in FIG. 4, when the axis 495 defined by the PIN-type photodiode 400 is aligned with the z-axis, light (e.g., of the particular wavelength range) may enter the PIN-type photodiode 400 through the aperture 490 traveling in a negative z-direction and be absorbed by the absorption material of the intrinsic region. When a photon of the particular wavelength is absorbed, a photoinduced electron is freed from the crystalline structure of the absorption material, thereby providing a photoinduced electron and a hole. The hole moves generally in the positive z-direction toward the p-type contact and the photoinduced electron moves generally in the negative z-direction toward the n-type contact. The hole reaching the p-type contact and/or the photoinduced electron reaching the n-type contact causes a voltage difference and/or current flow at the electrodes and/or pads 480A, 480B.

In various embodiments, the multi-layered intrinsic region 405 comprises a drift layer 440. In various embodiments, the drift layer 440 is configured to not absorb light of the particular wavelength range. For example, the drift layer 440 may be a non-absorbing drift layer. In various embodiments, the drift layer 440 is disposed between the absorbing region of the multi-layered intrinsic region 405 and the n-type contact 425 (e.g., n-type semiconductor contact layer 430). In particular, the PIN-type photodiode may be configured such that only the photoinduced electrons pass across the drift layer 440. For example, the PIN-type photodiode may be configured such that the holes do not cross the drift layer 440. For example, the drift layer 440 may be disposed at the boundary of the multi-layered intrinsic region 405 that abuts and/or directly borders the n-type contact 425.

In various embodiments, the drift layer 440 is configured to reduce the capacitance of the PIN junction of the PIN-type photodiode while having a minimal effect on the transit time for the photoinduced electrons. In general, the transit time for a photoinduced electron is the time between when the photoinduced electron is generated and when the photoinduced electron reaches the n-type contact 425. The shorter the transit time for the photoinduced electrons for the PIN-type photodiode, the faster the PIN-type photodiode can be modulated. In various embodiments, the drift layer comprises a material that provides for high mobility of the photoinduced electrons traveling therethrough.

In various embodiments, the drift layer 440 comprises a semiconductor material having a band gap energy such that the drift layer 440 essentially functions as a carrier transport layer. For example, the band gap energy of the drift layer 440 may be larger than the band gap energy of the absorption material (e.g., the first and/or second absorption material). In particular, the band gap energy of the drift layer 440 may be sufficiently large such as to prevent, or at least substantially reduce, the absorption of light of the particular wavelength range by the drift layer 440. In the illustrated embodiment, the drift layer 440 comprises an intrinsic or lightly n-type doped AlGaAs ($Al_xGa_{1-x}As$, x=(0 . . . 1)) compound semiconductor alloy. For example, the drift layer 440 may substantially undoped. In an example embodiment, the drift layer 440 has a thickness (e.g., in a direction substantially parallel to the axis 495) Td in the range of sub microns. For example, in an example embodiment, the drift layer 440 has a thickness Td in the range of 0.1 to 0.5 microns (e.g., 0.3 microns). The particular thickness to be used depends on the relative thicknesses of the other layers, in particular, the first and second absorption layers 460, 450, and may be customized depending on the desired characteristics for the PIN-type photodiode 400.

In various embodiments, the drift layer 440 is configured such that the electric field in the drift layer 440 is lower than the electric field in the absorption layer 460. In various embodiments, the reduction of electric field in the drift layer 440 with respect to the second absorption layer 450 is realized by the distribution of the dopant concentration in the second absorption layer 450 and the drift layer 440 and any buffer layer therebetween. In an example embodiment, the electric field in the drift layer 440 is reduced by n-type doping a region of the drift layer 440 adjacent to the second absorption layer 450 and/or providing an n-type doped buffer layer between the drift layer 440 and the second absorption layer 450. This doped region may be substantially thinner than the drift layer 440. In various embodiments, a thinner doped region will require higher doping levels, while a thicker region will require lower doping levels to achieve the desired reduction of the electric field in the drift layer 440. As should be understood, the main factor for achieving a particular reduction of the electric field in the drift layer 440 is the total fixed specific charge due to the n-type dopant introduced in a doped region of the drift layer 440 and/or a buffer layer between the drift layer 440 and the second absorption layer 450.

In various embodiments, the multi-layered intrinsic region 405 further comprises accelerating layer 435. In various embodiments, the accelerating layer 435 is configured to not absorb light in the particular wavelength range. For example, the accelerating layer 435 may be a non-absorbing accelerating layer. In various embodiments, the accelerating layer is configured to cause photoinduced electrons freed by the absorption of light by the first or second absorption material to have a greater drift speed. In various embodiments, the accelerating layer is disposed between the second absorbing layer 450 and the drift layer 440 (or the n-type contact 425 in embodiments not including a drift layer 440). In an example embodiment, the accelerating layer 435 comprises n-type doped AlGaAs (e.g., $Al_zGa_{1-z}As$, z=(0 . . . 1)). In an example embodiment, the accelerating layer 435 comprises n-type doped AlGaAs that comprises a concentration of an n-type dopant in a range of $1\times10^{15}$ to $1\times10^{17}$ per cubic centimeter. In various embodiments, the accelerating layer 435 has a thickness $T_n$ in a direction that is substantially parallel to the axis 495.

In various embodiments, the accelerating layer 435 causes the electric field within the first and second absorbing layers 460, 450 to be increased such that the drift velocity of photoinduced electrons is higher when the electrons are freed from the crystalline structure of the absorbing material. As the drift velocity of the photoinduced electrons is higher, the time it takes for the photoinduced electrons to reach the n-type contact 425 is lower. Thus, the accelerating layer 435 decreases the transit time of photoinduced electrons for the PIN-type photodiode 400 while increasing the 3-dB modulation bandwidth of the PIN-type photodiode.

In various embodiments, the multi-layered intrinsic region 405 comprises an absorption region 455 comprising a first absorption layer 460 and a second absorption layer 450. In various embodiments, the absorption region 455 may comprise multiple groups of first and second absorption layers, such as described with respect to FIG. 4. In various embodiments, the first absorption layer 460 is configured to absorb light of the particular wavelength range. In various embodiments, the first absorption layer 460 has a thickness $T_a$ in a direction that is substantially parallel to the axis 495. In various embodiments, the first absorption layer 460 comprises a first absorption material. In an example embodiment, the first absorption material is a semiconductor material configured to absorb light of the particular wavelength range. For example, the particular wavelength range may comprise the range 800-900 nm and/or a portion thereof and the first absorption material may be GaAs.

In various embodiments, the second absorption layer 450 is configured to absorb light of the particular wavelength range. In various embodiments, the second absorption layer 450 has a thickness $T_{in}$ in a direction that is substantially parallel to the axis 495. In various embodiments, the second absorption layer 450 comprises a second absorption material. In an example embodiment, the second absorption material is a semiconductor material configured to absorb light of the particular wavelength range. For example, the particular wavelength range may comprise the range 800-900 nm and/or a portion thereof and the second absorption material may be InGaAs (e.g., $In_yGa_{1-y}As$, y=(0 . . . 1)). In various embodiments, the second absorption material has a lower band gap energy than the first absorption material. In various embodiments, the second absorption material has a higher absorption coefficient than the first absorption material. For example, the first absorption layer 460 may be characterized by a first absorption coefficient and the second absorption layer 450 may be characterized by a second absorption coefficient, with the second absorption coefficient being greater than the first absorption coefficient. In various embodiments, the thickness $T_{in}$ of the second absorption layer 450 is less than the thickness $T_a$ of the first absorption layer 460. In an example embodiment, the thickness $T_{in}$ of the second absorption layer 450 may have an upper boundary defined by the strain relaxation of the first absorption material crystal lattice constant. For example, when the first absorption material is GaAs and the second absorption material is InGaAs, the thickness $T_{in}$ of the second absorption layer 450 may be equal to or less than a critical thickness governed and/or controlled by the saturation of the strain relaxation of the host GaAs crystal lattice constant corresponding to the amount of Indium added to the GaAs to form the InGaAs. In an example embodiment, the thickness of the absorbing region ($T_a+T_{in}$) may be in the range of half to two microns (e.g., 0.8 to 1.8 microns and/or approximately 1.3 microns).

In various embodiments, the second absorbing layer 450 is disposed and/or formed on a boundary of the absorbing region that abuts and/or directly borders the drift layer 440 (or in an embodiment not comprising a drift layer 440, the n-type contact 425). Thus, due to the higher absorption coefficient of the second absorbing layer 450, this positioning of the second absorbing layer 450 may increase the fraction of photoinduced electrons provided to the n-type semiconductor contact layer 430 in a relatively short period of time such that the transit time of photoinduced electrons for the PIN-type photodiode 400 is decreased while increasing the 3-dB modulation bandwidth of the PIN-type photodiode.

In various embodiments, the parameters $T_a$, $T_{in}$, $T_n$, and the composition $In_yGa_{1-y}As$, y=(0 . . . 1) of the PIN-type photodiode may be configured to provide a reduced and/or minimized capacitance (with respect to the capacitance of conventional PIN-type photodiodes) at a reduced and/or minimized photoinduced/hole transit time for a given sensitivity of the PIN-type photodiode that is appropriate for the application.

Technical Advantages

Conventional PIN-type photodiodes tend to fail to provide modulation speeds that are sufficient to keep up with the growing demands on optical communications. The limiting factor of the modulation speed is generally the transit time of the photoinduced electrons. Various embodiments provide technical solutions to this technical problem by providing PIN-type photodiodes that have reduced transit times compared to conventional PIN-type photodiodes. For example, through the use of one or more second absorption layers having a higher absorption coefficient than the first absorption layer(s), with one of the one or more second absorption layers disposed directly adjacent to an accelerating layer, drift layer, or n-type contact, the transit time for the photoinduced electrons is greatly reduced compared to conventional PIN-type photodiodes. In another example, through the use of an accelerating layer disposed between the absorption region and the drift layer or n-type contact, the drift velocity of photoinduced electrons may be increased compared to the drift speed of similarly induced photoinduced electrons in conventional PIN-type photodiodes. Thus various embodiments provide PIN-type photodiodes with reduced transit times. As such, various embodiments, provide PIN-type photodiodes with increased 3-dB modulation bandwidth without reducing the sensitivity of the PIN-type photodiode with respect to conventional PIN-type photodiodes.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A PIN-type photodiode comprising:
   a p-type contact;
   an n-type contact;
   a first absorbing layer characterized by a first absorption coefficient; and
   a second absorbing layer characterized by a second absorption coefficient, wherein the second absorption coefficient is greater than the first absorption coefficient,
   wherein the first absorbing layer is disposed between the p-type contact and the second absorbing layer,
   wherein the second absorbing layer is disposed between the first absorbing layer and a non-absorbing accelerating layer, wherein the non-absorbing accelerating layer is disposed between the second absorbing layer and a non-absorbing drift layer, the non-absorbing accelerating layer configured to cause an increase in drift speed of photoinduced electrons freed by absorption of light by the first absorbing layer and/or the second absorbing layer, and
   wherein the non-absorbing drift layer is disposed between the non-absorbing accelerating layer and the n-type contact, wherein the non-absorbing drift layer is a carrier transport layer having a third absorption coefficient, wherein the third absorption coefficient is less than the first absorption coefficient and the second absorption coefficient, wherein the non-absorbing drift layer is configured such that an electric field in the non-absorbing drift layer is lower than an electric field in the first absorbing layer and the second absorbing layer,
   wherein a thickness of the second absorbing layer has an upper boundary defined by a strain relaxation of a crystal lattice constant of the first absorbing layer.

2. The PIN-type photodiode of claim 1, wherein the first absorbing layer comprises GaAs and the second absorbing layer comprises InGaAs.

3. The PIN-type photodiode of claim 1, wherein the non-absorbing drift layer is disposed between the second absorbing layer and the n-type contact.

4. The PIN-type photodiode of claim 1, wherein the n-type contact comprises an n-type contact layer and an n-type semiconductor contact layer, the n-type semiconductor contact layer disposed between the second absorbing layer and the n-type contact layer.

5. The PIN-type photodiode of claim 1, further comprising:
   a third absorbing layer disposed between the second absorbing layer and the n-type contact, the third absorbing layer characterized by the first absorption coefficient; and
   a fourth absorbing layer disposed between the third absorbing layer and the n-type contact, the fourth absorbing layer characterized by the second absorption coefficient.

6. The PIN-type photodiode of claim 1, further comprising a substrate, wherein the n-type contact is disposed on the substrate.

7. The PIN-type photodiode of claim 1, further comprising a first electrode in electrical communication with the p-type contact and a second electrode in electrical communication with the n-type contact.

8. The PIN-type photodiode of claim 1, wherein the non-absorbing accelerating layer has an n-type doping concentration in a range of $1 \times 10^{15}$ to $1 \times 10^{17}$ per cubic centimeter and is disposed between (a) the second and first absorbing layers and (b) the n-type contact.

9. The PIN-type photodiode of claim 1, wherein the first absorbing layer and the second absorbing layer are configured to absorb light in a wavelength range comprising at least a portion of a range of 800-900 nm.

10. A PIN-type photodiode comprising:
    a p-type contact;
    an n-type contact;
    a first absorbing layer characterized by a first absorption coefficient; and
    a second absorbing layer characterized by a second absorption coefficient, wherein the second absorption coefficient is greater than the first absorption coefficient,
    wherein the second absorbing layer is disposed between the first absorbing layer and a non-absorbing accelerating layer,
    a non-absorbing drift layer disposed between the non-absorbing accelerating layer and the n-type contact, wherein the non-absorbing drift layer is configured such that an electric field in the non-absorbing drift layer is lower than an electric field in the first absorbing layer and the second absorbing layer, wherein the non-absorbing accelerating layer is disposed between the second absorbing layer and the n-type contact, the non-absorbing accelerating layer configured to cause an increase in drift speed of photoinduced electrons freed by absorption of light by the first absorbing layer and/or the second absorbing layer, and wherein a thickness of the first absorbing layer, a thickness of the second absorbing layer, and a thickness of the non-absorbing accelerating layer are configured to minimize a capacitance of the PIN-type photodiode at a minimum photoinduced transit time for a given sensitivity of the PIN-type photodiode, wherein the thickness of the second absorbing layer has an upper boundary defined by a strain relaxation of a crystal lattice constant of the first absorbing layer.

11. The PIN-type photodiode of claim 10, wherein the first absorbing layer comprises GaAs and the non-absorbing accelerating layer comprises n-type doped AlGaAs.

12. The PIN-type photodiode of claim 11, wherein the n-type doped AlGaAs comprises a concentration of n-type dopant in a range of $1 \times 10^{15}$ to $1 \times 10^{17}$ per cubic centimeter.

13. The PIN-type photodiode of claim 10, wherein the non-absorbing accelerating layer comprises n-type doped AlGaAs disposed between the second absorbing layer and the n-type contact.

14. The PIN-type photodiode of claim 10, further comprising a substrate, wherein the n-type contact is disposed on the substrate.

15. The PIN-type photodiode of claim 10, further comprising a first electrode in electrical communication with the p-type contact and a second electrode in electrical communication with the n-type contact.

16. The PIN-type photodiode of claim 10, wherein the first absorbing layer is configured to absorb light in a wavelength range comprising at least a portion of a range of 800-900 nm.

17. The PIN-type photodiode in claim 10,
wherein the non-absorbing drift layer is a carrier transport layer having a third absorption coefficient, wherein the third absorption coefficient is less than the first absorption coefficient and the second absorption coefficient.

18. The PIN-type photodiode of claim 10, wherein an aggregate thickness of the first absorbing layer and the second absorbing layer is in a range of approximately 0.8 microns to 1.8 microns.

19. The PIN-type photodiode of claim 10, wherein the PIN-type photodiode has the sensitivity in a range of approximately 0.1 to 0.8 Amp per Watt, and wherein the PIN-type photodiode has a 3-dB modulation bandwidth in a range of approximately 15 to 100 GHz.

20. The PIN-type photodiode of claim 1, wherein a thickness of the first absorbing layer, the thickness of the second absorbing layer, and a thickness of the non-absorbing accelerating layer are configured to minimize a capacitance of the PIN-type photodiode at a minimum photoinduced transit time for a given sensitivity of the PIN-type photodiode.

21. The PIN-type photodiode of claim 20, wherein the PIN-type photodiode has the sensitivity in a range of approximately 0.1 to 0.8 Amp per Watt, and wherein the PIN-type photodiode has a 3-dB modulation bandwidth in a range of approximately 15 to 100 GHz.

22. The PIN-type photodiode of claim 20, wherein an aggregate thickness of the first absorbing layer and the second absorbing layer is in a range of approximately 0.8 microns to 1.8 microns.

23. The PIN-type photodiode of claim 1, wherein the lower electric field in the non-absorbing drift layer is realized by a distribution of n-type dopant concentration in the first absorption layer, the second absorption layer, and the non-absorbing drift layer.

24. The PIN-type photodiode of claim 10, wherein the lower electric field in the non-absorbing drift layer is realized by a distribution of n-type dopant concentration in the first absorption layer, the second absorption layer, and the non-absorbing drift layer.

* * * * *